United States Patent
Chen

(10) Patent No.: US 9,420,649 B1
(45) Date of Patent: Aug. 16, 2016

(54) DRIVER CIRCUIT FOR SWITCHING SWITCH ACCORDING TO CAPACITOR VOLTAGE

(71) Applicant: FEELING TECHNOLOGY CORP., Hsinchu (TW)

(72) Inventor: Yi-Sheng Chen, Hsinchu (TW)

(73) Assignee: Feeling Technology Corp., Chupei, Hsinchu (TW)

( * ) Notice: Subject to any disclaimer, the term of this patent is extended or adjusted under 35 U.S.C. 154(b) by 0 days.

(21) Appl. No.: 14/823,087

(22) Filed: Aug. 11, 2015

(30) Foreign Application Priority Data

May 1, 2015 (TW) .............................. 104114035 A

(51) Int. Cl.
*H05B 33/08* (2006.01)
*H03K 17/687* (2006.01)

(52) U.S. Cl.
CPC .......... *H05B 33/0815* (2013.01); *H03K 17/687* (2013.01); *H05B 33/0845* (2013.01)

(58) Field of Classification Search
CPC ........... H05B 33/0815; H05B 33/0845; H05B 33/0809; H02M 1/14; H03K 17/687
See application file for complete search history.

(56) References Cited

U.S. PATENT DOCUMENTS 9,190,895 B1 * 11/2015 Chen ...................... H02M 1/14
2007/0267978 A1 * 11/2007 Shteynberg ........ H05B 33/0818
315/247

* cited by examiner

*Primary Examiner* — Tung X Le
*Assistant Examiner* — Raymond R Chai
(74) *Attorney, Agent, or Firm* — Rosenberg, Klein & Lee

(57) ABSTRACT

A driver circuit for switching switch according to capacitor voltage is disclosed in the present invention. The driver circuit is provided to drive a load circuit which includes a load resistor under a continuous conduction mode (CCM). In the driver circuit, a first current module which electrically connected to the load resistor is provided to generate a variable current. A second current module which electrically connected to the first switch and the first current module is provided to generate a constant current. A processing module is electrically connected to the first capacitor, the second capacitor and a gate of the first and the second switch. The processing module is provided to conduct one of the first switch and the second switch according to a size of the variable current and the constant current, a voltage of the first capacitor, and a voltage of the second capacitor.

7 Claims, 3 Drawing Sheets

DRIVER CIRCUIT FOR SWITCHING SWITCH ACCORDING TO CAPACITOR VOLTAGE

This application claims the benefit of Taiwan Patent Application Serial No. 104114035, filed May 1, 2015, the subject matter of which is incorporated herein by reference.

BACKGROUND OF INVENTION

1. Field of the Invention

The present invention is related to a driver circuit for switching switch according to capacitor voltage, and more particularly related to a driver circuit for switching switch according to capacitor voltage which controls the average current by switching switch according to capacitor voltage under a continuous conduction mode (CCM).

2. Description of the Prior Art

FIG. 1 is a circuit diagram showing a conventional integrated light emitted diode (LED) circuit. As shown, the conventional integrated LED circuit PA1 includes a load circuit PA11 and a driver circuit PA12. The load circuit PA11 is a LED circuit, and further includes a voltage source PA111, a full bridge rectifier circuit PA112, a resistor PA113, a diode PA114, a capacitor PA115, at least a LED PA116, an inductor PA117, a first switch PA118, a resistor PA119, a capacitor PA120, and a capacitor PA121.

The full bridge rectifier PA112 is coupled to the voltage source PA111 and coupled to the resistor PA113, the diode PA114, the capacitor PA115, and the LED PA116. The inductor PA117 has one end coupled to the diode PA114 and the drain of the first switch PA118 and another end coupled to the capacitor PA115 and the LED PA116. The resistor PA119 is coupled to the source of the first switch PA118 and also to CS node of the driver circuit PA12. The capacitor PA120 is coupled to the resistor PA113 and also to VCC node of the driver circuit PA12. The capacitor PA121 is coupled to COMP node of the driver circuit PA12. The first switch PA118 is coupled to OUT node of the driver circuit PA12.

As the first switch PA118 is conducted, an average circuit Ia is generated flowing through the LED PA116 and an inductor current Ib is generated flowing through the inductor PA117. In general, operation mode of the load circuit PA11 is decided by on time of the first switch PA118, which may control the increasing and decreasing of the inductor current Ib. The average of the peak value and the valley value of the inductor current Ib is the average current Ia. The above mentioned operation modes include the continuous conduction mode (CCM) and the discontinuous conduction mode (DCM).

However, each of the operation modes has both advantage and disadvantage. Take the CCM mode for example, CCM mode has the advantage of small input and output ripple, small total harmonic distortion (THD) and Electro Magnetic Interference (EMI), and easier to executing filtering task, however, under the restriction of circuit design, the load circuit PA11 in present cannot generate an average current Ia to drive the LED PA116 stably such that the light generated by the LED PA116 would be unstable.

For example, under CCM, because the initial charging current of the inductor PA117 in each cycle might be different, the timing to turn on the first switch PA118 cannot be identified accordingly, and the value of the inductor current Ib can be only detected after the first switch PA118 is conducted. In order to output the average current Ia averagely, the time to turn off the first switch PA118 would be varied. In order to output the average current Ia with the default value, it is the conventional method to record the timing the increasing inductor current Ib reaches the default value of the average current Ia but not to turn off the first switch PA118 immediately, the first switch PA118 would be turned off after the inductor current Ib exceeding the default value of the average current Ia for a while (double the time reaching the default value in general). However, such method can only be applied to the inductor PA117 under linear operation. If the inductor PA117 is under nonlinear operation, charging and discharging curves of the inductor current when the first switch PA118 is turned on or off would be nonlinear (such as the case of quick charge/discharge), such that the adjusted average current cannot be the default value (for example, the present value is 1 A but the adjusted average current under the restriction of nonlinear operation is 0.7 A). Thus, there exists the need to improve the technology in present.

SUMMARY OF THE INVENTION

Under the restriction of the circuit design in present, it is a general problem that the adjusted average current cannot reach the present value as the inductor is under nonlinear operation. Accordingly, it is a main object of the present invention to provide a driver circuit for switching switch according to capacitor voltage which controls on and off of the switch based on the difference between variable current and constant current and the voltage levels of the two capacitors under CCM, to have the adjusted average current identical to the default value, no matter the inductor is under linear operation or nonlinear operation, such that the above mentioned problem can be resolved.

In accordance with the above mentioned object, a driver circuit for switching switch according to capacitor voltage is provided in the present invention. The driver circuit for switching switch according to capacitor voltage is utilized to control an average current to drive a load circuit under a continuous conduction mode (CCM). The load circuit includes a load resistor. The load resistor has one end grounded and another end receiving a load resistor voltage. The driver circuit for switching switch according to capacitor voltage comprises a first switch, a first current output module, a second current output module, a first capacitor, a second switch, a second capacitor, a constant voltage module, and a processing module. The first switch has a first switching connection end and a second switching connection end. The first current module, which has a first current output end electrically connected to the first switching connection end, is electrically connected to the load resistor to generate a variable current according to the load resistor voltage. The second current module has a second current output end electrically connected to the first switching connection end and the first current output end of the first current module to generate a constant current. The first capacitor has one end electrically connected to the second switching connection end and another end grounded. The second switch has a third switching connection end and a fourth switching connection end, and the third switching connection being electrically connected to the first capacitor and the second switching connection end. The second capacitor has one end electrically connected to the fourth switching connection end and another end grounded. The constant voltage module is electrically connected to the second capacitor and the fourth switching connection end to provide a constant voltage supplied to the second capacitor. The processing module is electrically connected to the first capacitor, the second capacitor, and gates of the first switch and the second switch to conduct one of the first switch and the second switch.

As the processing module conducts the first switch and turns off the second switch and the variable current is greater than the constant current, a charging current is generated based on difference between the variable current and the constant current to charge the first capacitor, and the variable current gradually decreases attending with increasing of the load resistor voltage; as the variable current is smaller than the constant current, a discharging current, which is identical to the difference between the constant current and the variable current, is generated by the first capacitor, and as the first capacitor is discharged to have a first capacitor voltage of the first capacitor equals to a second capacitor voltage of the second capacitor, the processing module is triggered to turn off the first switch and conduct the second switch so as to control the average current to drive the load circuit.

In accordance with a preferred embodiment of the driver circuit for switching switch according to capacitor voltage, the first current output module comprises a first comparator, a first transistor, a resistor, and a current mirror. The first comparator has a first comparing input, a second comparing input, and a first comparing output. The first comparing input receives a first reference voltage, and the first comparing output is utilized to provide a first reference current according to the first reference voltage. The first transistor has a gate electrically connected to the first comparing output of the first comparator. The first resistor has a first end and a second end. The first end is electrically connected to the second comparing input and a source of the first transistor, and the second end is electrically connected to the load resistor to receive the load resistor voltage so as to have the first transistor and the first resistor receive the first reference current to generate the variable current according to the resistor load voltage. The current mirror has a connection output and the first current output. The connection output is electrically connected to the drain of the first transistor and output the variable current to have the first current output output the variable current according to the connection output.

In accordance with a preferred embodiment of the driver circuit for switching switch according to capacitor voltage, the second current output module comprises a second comparator, a second transistor, and a second resistor. The second comparator has a third comparing input, a fourth comparing input, and a second comparing output. The third comparing input receives a second reference voltage, and the second comparing output is utilized to provide a second reference current according to the second reference voltage. The second transistor has a gate electrically connected to the second comparing output and has a drain as the second current output electrically connected to the first current output to output the constant current according to the second reference current. The second resistor, which has an end electrically connected to the fourth comparing input and a source of the second transistor and another end grounded, is utilized for receiving the constant current. In addition, the first reference voltage is greater than the second reference voltage.

In accordance with a preferred embodiment of the driver circuit for switching switch according to capacitor voltage, the constant voltage module comprises a constant current source and a third transistor. The constant current source is electrically connected to the second capacitor and the fourth switching connection end of the second switch to provide a steady current. The third transistor has a source grounded, and a gate and a drain of the third resistor are electrically connected to the constant current source to provide the constant voltage according to the steady current. In addition, the load circuit is a light emitted diode (LED) circuit. The constant voltage is identical to the second capacitor voltage.

By using the technology of the driver circuit for switching switch according to capacitor voltage provided in accordance with the present invention, because on/off of the switch is controlled based on the difference between variable current and constant current and the voltage levels of the two capacitors, charging and discharging of the capacitor can be adequately controlled to stabilize the average current so as to have the adjusted average current identical to the default value, no matter the inductor is under linear operation or nonlinear operation, such that the problem of the conventional art can be resolved.

BRIEF DESCRIPTION OF THE DRAWINGS

The present invention will now be specified with reference to its preferred embodiment illustrated in the drawings, in which.

DESCRIPTION OF THE PREFERRED EMBODIMENT

There are various embodiments of the driver circuit for switching switch according to capacitor voltage provided in accordance with the present invention, which are not repeated hereby. Only one preferred embodiment is mentioned in the following paragraph as an example.

Figure 2:
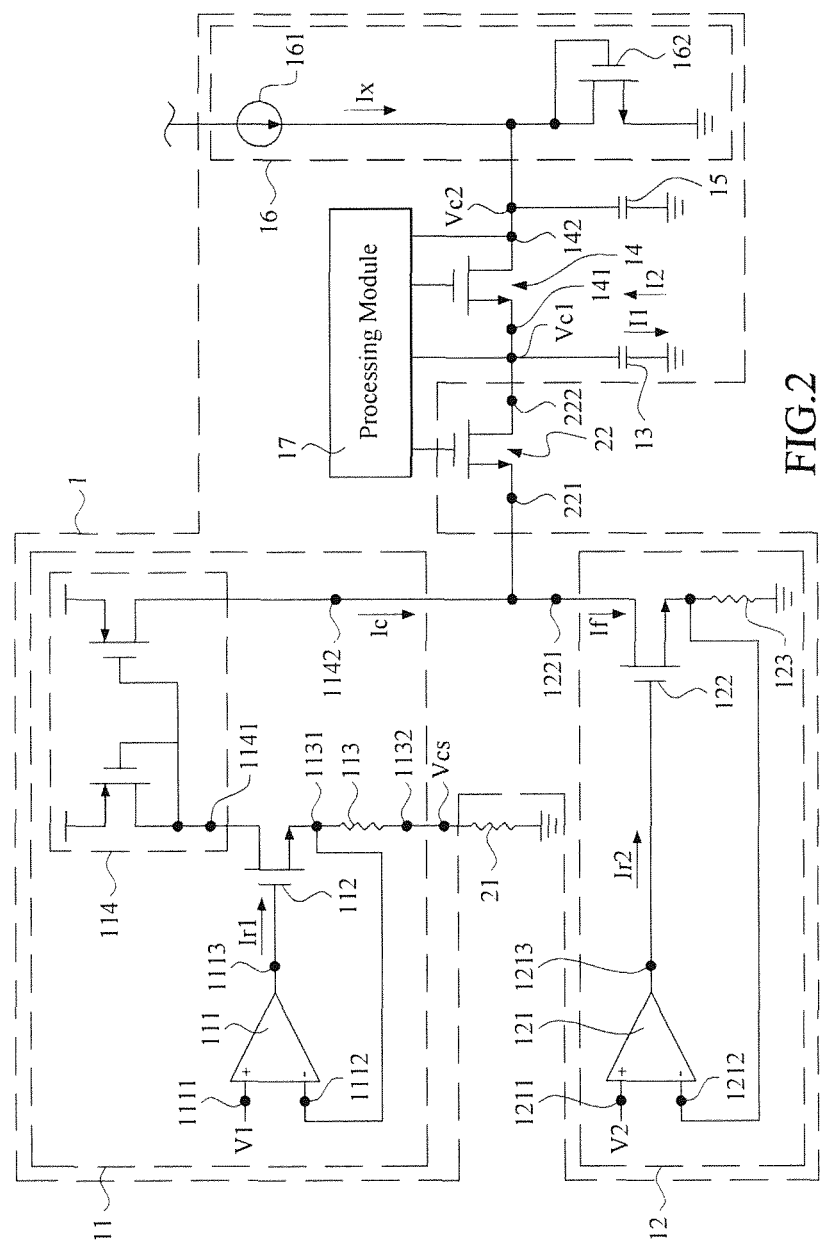
FIG. 2 is a circuit diagram of a driver circuit for switching switch according to capacitor voltage in accordance with a preferred embodiment of the present invention.
Figure 3:
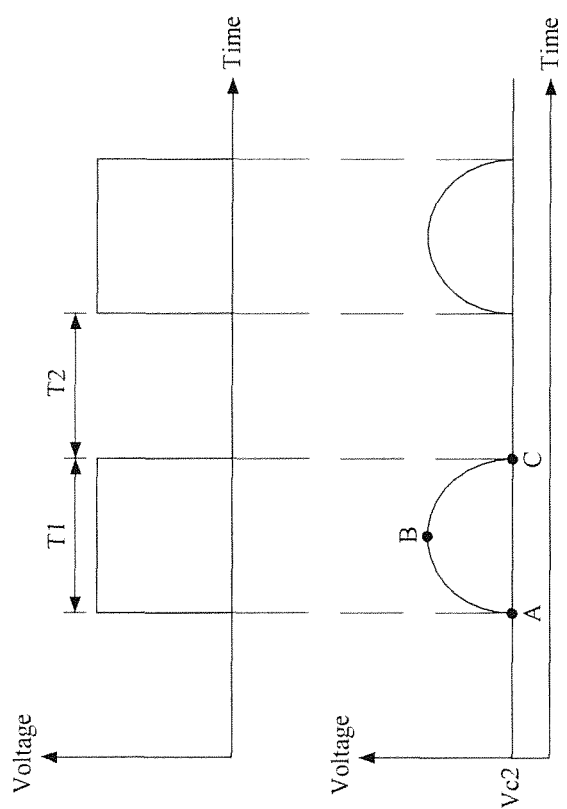
FIG. 3 is a schematic diagram showing waveforms corresponding to switching of the first switch and charging/discharging of the capacitor in accordance with a preferred embodiment of the present invention.

Please refer to FIG. 2 and FIG. 3, of which FIG. 2 is a circuit diagram of a driver circuit for switching switch according to capacitor voltage in accordance with a preferred embodiment of the present invention and FIG. 3 is a schematic diagram showing the waveforms corresponding to switching of the first switch and charging/discharging of the capacitor in accordance with a preferred embodiment of the present invention.

As shown, a driver circuit 1 for switching switch according to capacitor voltage in accordance with the preferred embodiment of the present invention is provided to control an average current (not shown but corresponding to the average current Ia of FIG. 1) to drive a load circuit (not shown) under continuous conduction mode (CCM). The load circuit is a light emitted diode (LED) circuit. However, the present invention is not so restricted.

Figure 1:
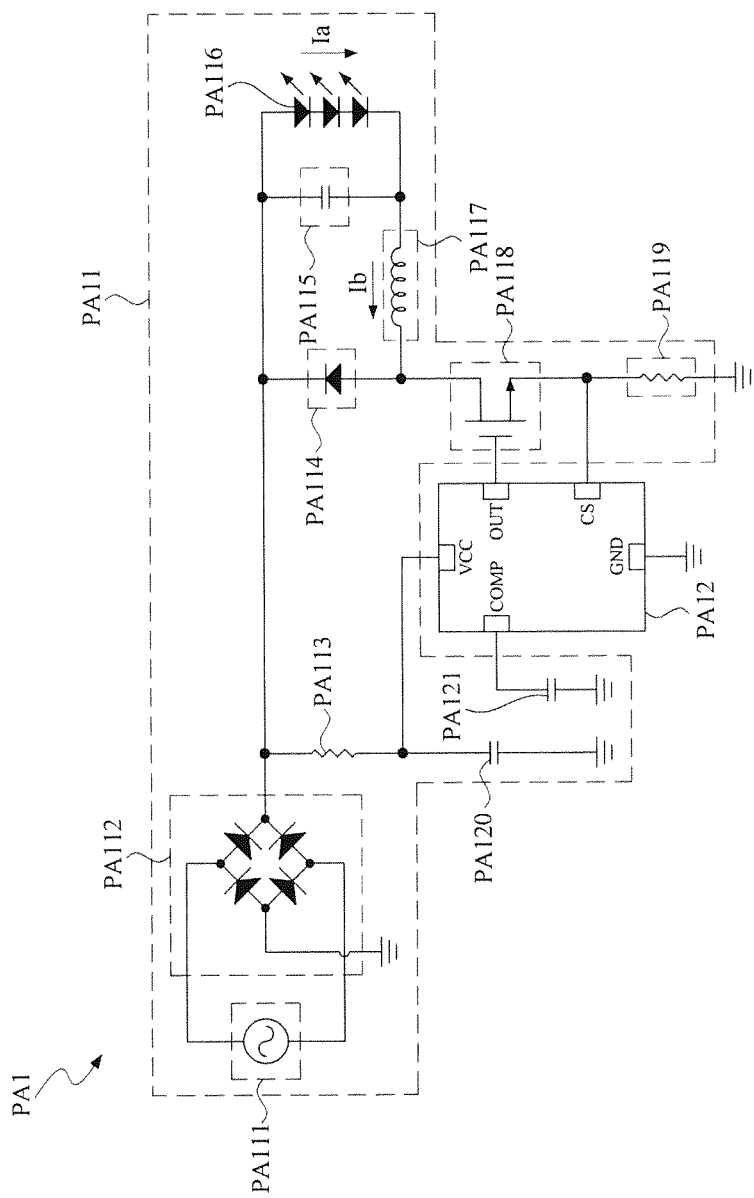
FIG. 1 is a circuit diagram of a conventional integrated light emitted diode (LED) circuit.

The load circuit includes a load resistor 21. The load resistor 21 has one end grounded and another end receiving a load resistor voltage Vcs. In addition, the load circuit may include the elements such as the voltage source, the full bridge rectifier, the resistor, the diode, the capacitor, the LED, and the inductor as shown in FIG. 1, which are well known in the art and thus is not repeated here.

The driver circuit 1 for switching switch according to capacitor voltage includes a first switch 22, a first current output module 11, a second current output module 12, a first capacitor 13, a second switch 14, a second capacitor 15, a constant voltage module 16, and a processing module 17.

The first switch 22 has a first switching connection end 221 and a second switching connection end 222. The first current output module 11 includes a first comparator 111, a first transistor 112, a first resistor 113, and a current mirror 114.

The first comparator 111 includes a first comparing input 1111, a second comparing input 1112, and a first comparing output 1113. The first comparing input 1111 is utilized for receiving a first reference voltage V1. The first transistor 112 has a gate electrically connected to the first comparing output 1113 of the first comparator 111. The first resistor 113 has a first end 1131 and a second end 1132. The first end 1131 is electrically connected to the second comparing input 1112 and a source of the first transistor 112. The second end 1132 is electrically connected to the load resistor 21 to receive the load resistor voltage Vcs. The current mirror 114 has a connection output 1141 and a first current output 1142. The connection output 1141 is electrically connected to the drain of the first transistor 112.

The second current output module 12 includes a second comparator 121, a second transistor 122, and a second resistor 123. The second comparator 121 has a third comparing input 1211, a fourth comparing input 1212, and a second comparing output 1213. The third comparing input 1211 is utilized for receiving a second reference voltage V2. The second transistor 122 has a gate electrically connected to the second comparing output 1213 and has a drain as the second current output 1221 electrically connected to the first current output 1142 and the first switching connection end 221. The second resistor 123 has one end electrically connected to the fourth comparing input 1212 and a source of the second transistor 122 and another end grounded. In general, resistance of the second resistor 123 might be identical to that of the first resistor 113. In addition, the first reference voltage V1 is greater than the second reference voltage V2. The first reference V1 might be double the second reference voltage V2 in general. However, the present invention is not so restricted.

The first capacitor 13 has one end electrically connected to the second switching connection end 222 of the first switch 22 and another end grounded to store a first capacitor voltage Vc1. The second switch 14 has a third switching connection end 141 and a fourth switching connection end 142. The third switching connection end 141 is electrically connected to the first capacitor 13 and the second switching connection end 222 of the first switch 22.

The second capacitor 15 has one end electrically connected to the fourth switching connection end 142 and another end grounded to store a second capacitor voltage Vc2. The constant voltage module 16 is electrically connected to the second capacitor 15 and the fourth switching connection end 142 to provide a constant voltage (not labeled in the figure) as the voltage supplied to the second capacitor 15. Concretely speaking, the constant voltage module 16 includes a constant current source 161 and a third transistor 162. The constant current source 161 is electrically connected to the second capacitor 15 and the fourth switching connection end 142 of the second switch 14 to provide a steady current Ix. The third transistor 162 has a source grounded, and has a gate and a drain electrically connected to the constant current source 161 so as to provide a stable constant voltage according to the steady current Ix. That is, in practice, the second capacitor voltage Vc2 would be identical to the constant voltage, which is about 0.7V.

The processing module 17 is electrically connected to the first capacitor 13, the second capacitor 15, and the gates of the first switch 22 and the second switch 14. The processing module 17 can be a circuit with processing capability, which includes a comparator in general, to compare the value of the first capacitor voltage Vc1 and the second capacitor voltage Vc2.

The first comparing output 1113 outputs a first reference current Ir1 based on the first reference voltage V1. The first transistor 112 and the first resistor 113 would generate a variable current Ic according to the load resistor voltage Vcs at the second end 1132 of the first resistor 113 after receiving the first reference current Ir1. The variable current Ic is also outputted from the connection output 1141 of the current mirror 114 so as to have the first current output 1142 output a mirror current identical to the variable current Ic outputted from the connection output 1141.

The second comparing output 1213 outputs a second reference current Ir2 based on the second reference voltage V2. The second transistor 122 has a drain which outputs a constant current If according to the second reference current Ir2, and the constant current If is received by the second resistor 123 so as to have the end voltage of the second resistor 123 kept unchanged so as to have the second reference current Ir2 transformed into the unchanged constant current If. The processing module 17 is utilized to conduct one of the first switch 22 and the second switch 14 to equal the initial voltage of both capacitors 13 and 15. As mentioned, because the first reference voltage V1 is double the second reference voltage V2, as the load resistor voltage Vcs is zero, the variable current Ic would be double the constant current If, i.e. 2If=Ic.

Concretely speaking, as shown in FIG. 3, as the processing module 17 conducts the first switch 22 and turns off the second switch 14 (i.e. corresponding to time zone T1 of FIG. 3, and the upper diagram of FIG. 3 represents the waveform corresponding to on/off of the first switch 22) and the variable current Ic is greater than the constant current If, a charging current I1 is generated based on difference between the variable current Ic and the constant current If to charge the first capacitor 13. The conduction of the first switch 22 may direct the average current following through the load resistor 21 of the load circuit to gradually increase the load resistor voltage Vcs (begins from point A). The variable current Ic would be gradually reduced attending with the increasing of the load resistor voltage Vcs. Then, the load resistor voltage Vcs may reach point B in FIG. 3, in which the variable current Ic is identical to the constant current If.

Then, the variable current Ic would be smaller than the constant current If to have the first capacitor 13 generate a discharging current I2, which is identical to the difference between the constant current If and the variable current Ic. As the first capacitor 13 is discharged to have the first capacitor voltage Vc1 of the first capacitor 13 identical to the second capacitor voltage Vc2 of the second capacitor 15 (from point B to point C), the processing module 17 would be triggered to turn off the first switch 22 and conduct the second switch 14 and the time zone T2 begins to complete the whole switching operation of the first switch 22. Thus, on and off states of the first switch 22 can be stably controlled to adjust the increasing and decreasing of the inductor current (i.e. as the first switch 22 is turned on, the current flowing through the inductor PA117 as shown in FIG. 1 would be increased, whereas, as the first switch 22 is turned off, the current flowing through the inductor PA117 would be reduced, and the average of the highest peak value and the lowest peak value is the average current) so as to control the average current to drive the load circuit.

In sum, by using the technology of the driver circuit for switching switch according to capacitor voltage provided in accordance with the present invention, because the period of on time is controlled based on the difference between variable current and constant current and the voltage of two capacitors, charging and discharging of the capacitor can be adequately controlled to stabilize the average current so as to output the adjusted average current identical to the default value, no matter the inductor is under linear operation or nonlinear operation, such that the problem of the conventional art can be resolved.

The detail description of the aforementioned preferred embodiments is for clarifying the feature and the spirit of the present invention. The present invention should not be limited by any of the exemplary embodiments described herein, but should be defined only in accordance with the following claims and their equivalents. Specifically, those skilled in the art should appreciate that they can readily use the disclosed conception and specific embodiments as a basis for designing or modifying other structures for carrying out the same purposes of the present invention without departing from the scope of the invention as defined by the appended claims.

What is claimed is:

1. A driver circuit for switching switch according to capacitor voltage, utilized to control an average current to drive a load circuit under a continuous conduction mode (CCM), the load circuit including a load resistor which has one end grounded and another end receiving a load resistor voltage, and the driver circuit comprising:
    a first switch, which has a first switching connection end and a second switching connection end;
    a first current module, which has a first current output end electrically connected to the first switching connection end, electrically connected to the load resistor to generate a variable current according to the load resistor voltage;
    a second current module, having a second current output end electrically connected to the first switching connection end and the first current output end of the first current module to generate a constant current;
    a first capacitor, having one end electrically connected to the second switching connection end and another end grounded;
    a second switch, having a third switching connection end and a fourth switching connection end, and the third switching connection being electrically connected to the first capacitor and the second switching connection end;
    a second capacitor, having one end electrically connected to the fourth switching connection end and another end grounded;
    a constant voltage module, electrically connected to the second capacitor and the fourth switching connection end to provide a constant voltage supplied to the second capacitor; and
    a processing module, electrically connected to the first capacitor, the second capacitor, and gates of the first switch and the second switch to conduct one of the first switch and the second switch;
    wherein, as the processing module conducts the first switch and turns off the second switch and the variable current is greater than the constant current, a charging current is generated based on difference between the variable current and the constant current to charge the first capacitor, and the variable current gradually decreases attending with increasing of the load resistor voltage; as the variable current is smaller than the constant current, a discharging current, which is identical to the difference between the constant current and the variable current, is generated by the first capacitor, and as the first capacitor is discharged to have a first capacitor voltage of the first capacitor identical to a second capacitor voltage of the second capacitor, the processing module is triggered to turn off the first switch and conduct the second switch so as to control the average current to drive the load circuit.

2. The driver circuit for switching switch according to capacitor voltage of claim 1, wherein the first current output module comprises:
    a first comparator, having a first comparing input, a second comparing input, and a first comparing output, the first comparing input receiving a first reference voltage, and the first comparing output providing a first reference current according to the first reference voltage;
    a first transistor, having a gate electrically connected to the first comparing output of the first comparator;
    a first resistor, having a first end and a second end, the first end being electrically connected to the second comparing input and a source of the first transistor, the second end being electrically connected to the load resistor to receive the load resistor voltage so as to have the first transistor and the first resistor receive the first reference current to generate the variable current according to the resistor load voltage; and
    a current mirror, having a connection output and the first current output, the connection output being electrically connected to the drain of the first transistor and outputting the variable current to have the first current output the variable current according to the connection output.

3. The driver circuit for switching switch according to capacitor voltage of claim 2, wherein the second current output module comprises:
    a second comparator, having a third comparing input, a fourth comparing input, and a second comparing output, the third comparing input receiving a second reference voltage, and the second comparing output providing a second reference current according to the second reference voltage;
    a second transistor, having a gate electrically connected to the second comparing output and having a drain as the second current output electrically connected to the first current output to output the constant current according to the second reference current; and
    a second resistor, which has an end electrically connected to the fourth comparing input and a source of the second transistor and another end grounded, utilized for receiving the constant current.

4. The driver circuit for switching switch according to capacitor voltage of claim 3, wherein the first reference voltage is greater than the second reference voltage.

5. The driver circuit for switching switch according to capacitor voltage of claim 1, wherein the constant voltage module comprises:
    a constant current source, electrically connected to the second capacitor and the fourth switching connection end of the second switch to provide a steady current; and
    a third transistor, having a source grounded, and a gate and a drain of the third transistor being electrically connected to the constant current source to provide the constant voltage according to the steady current.

6. The driver circuit for switching switch according to capacitor voltage of claim 1, wherein the load circuit is a light emitted diode (LED) circuit.

7. The driver circuit for switching switch according to capacitor voltage of claim 1, wherein the constant voltage is identical to the second capacitor voltage.

* * * * *